US012757330B2

(12) United States Patent
Lun et al.

(10) Patent No.: US 12,757,330 B2
(45) Date of Patent: Oct. 6, 2026

(54) LENS MODULE WITH MULTI-LAYER BENT CIRCUIT BOARD AND ELECTRONIC DEVICE HAVING THE SAME

(71) Applicant: TRIPLE WIN TECHNOLOGY(SHENZHEN) CO. LTD., Shenzhen (CN)

(72) Inventors: Zheng-Zhi Lun, Jin Cheng (CN); Zhi-Hao Si, Jincheng (CN); Hui-Hui Shang Guan, Jin Cheng (CN); Hu Zhu, Jin Cheng (CN); Xiao-Fei Wang, Jin Cheng (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 56 days.

(21) Appl. No.: 18/919,865

(22) Filed: Oct. 18, 2024

(65) Prior Publication Data

US 2025/0331104 A1 Oct. 23, 2025

(30) Foreign Application Priority Data

Apr. 18, 2024 (CN) ......................... 202420813732.1

(51) Int. Cl.

| | |
|---|---|
| ***H05K 1/14*** | (2006.01) |
| ***H04N 23/52*** | (2023.01) |
| ***H04N 23/54*** | (2023.01) |
| ***H04N 23/68*** | (2023.01) |
| ***H05K 1/02*** | (2006.01) |

(52) U.S. Cl.
CPC ............. *H05K 1/147* (2013.01); *H04N 23/54* (2023.01); *H04N 23/687* (2023.01); *H05K 1/0215* (2013.01); *H04N 23/52* (2023.01); *H05K 2201/09027* (2013.01); *H05K 2201/10151* (2013.01)

(58) Field of Classification Search
CPC ................. H05K 1/147; H05K 1/0215; H05K 2201/09027; H05K 2201/10151; H05K 1/148; H05K 1/189; H04N 23/54; H04N 23/687; H04N 23/52; H04N 23/55; H04N 23/57
See application file for complete search history.

(56) References Cited

U.S. PATENT DOCUMENTS

| | | | | |
|---|---|---|---|---|
| 2013/0136437 A1* | 5/2013 | Asakawa | G02B 27/64 | 396/55 |
| 2016/0170227 A1* | 6/2016 | Minamisawa | H04N 23/57 | 359/557 |
| 2022/0146782 A1* | 5/2022 | Ni | G02B 27/646 | |
| 2023/0019176 A1* | 1/2023 | Mak | H04N 23/51 | |

* cited by examiner

*Primary Examiner* — Gevell V Selby
(74) *Attorney, Agent, or Firm* — ScienBiziP, P.C.

(57) ABSTRACT

A lens module includes a lens assembly, a sensing assembly with a supporting member and a sensor, a first circuit board, and a second circuit board. The supporting member is on one side of the lens assembly. The sensor is between them. The first circuit board is adjacent in another direction. The second circuit board connects the sensor and the first circuit board.

18 Claims, 6 Drawing Sheets

LENS MODULE WITH MULTI-LAYER BENT CIRCUIT BOARD AND ELECTRONIC DEVICE HAVING THE SAME

FIELD

The subject matter herein generally relates to optical imaging, particularly to a lens module and an electronic device having the lens module.

BACKGROUND

Sensor-Shift technology achieves image stabilization by moving a sensor. The technology typically involves connecting the sensor to a printed circuit board (PCB) through two bent flexible printed circuits (FPCs) to form a lens module. However, such lens module may have a large size.

BRIEF DESCRIPTION OF THE DRAWINGS

Implementations of the present technology will now be described, by way of example only, with reference to the attached FIGS., wherein.

DETAILED DESCRIPTION

Figure 1:
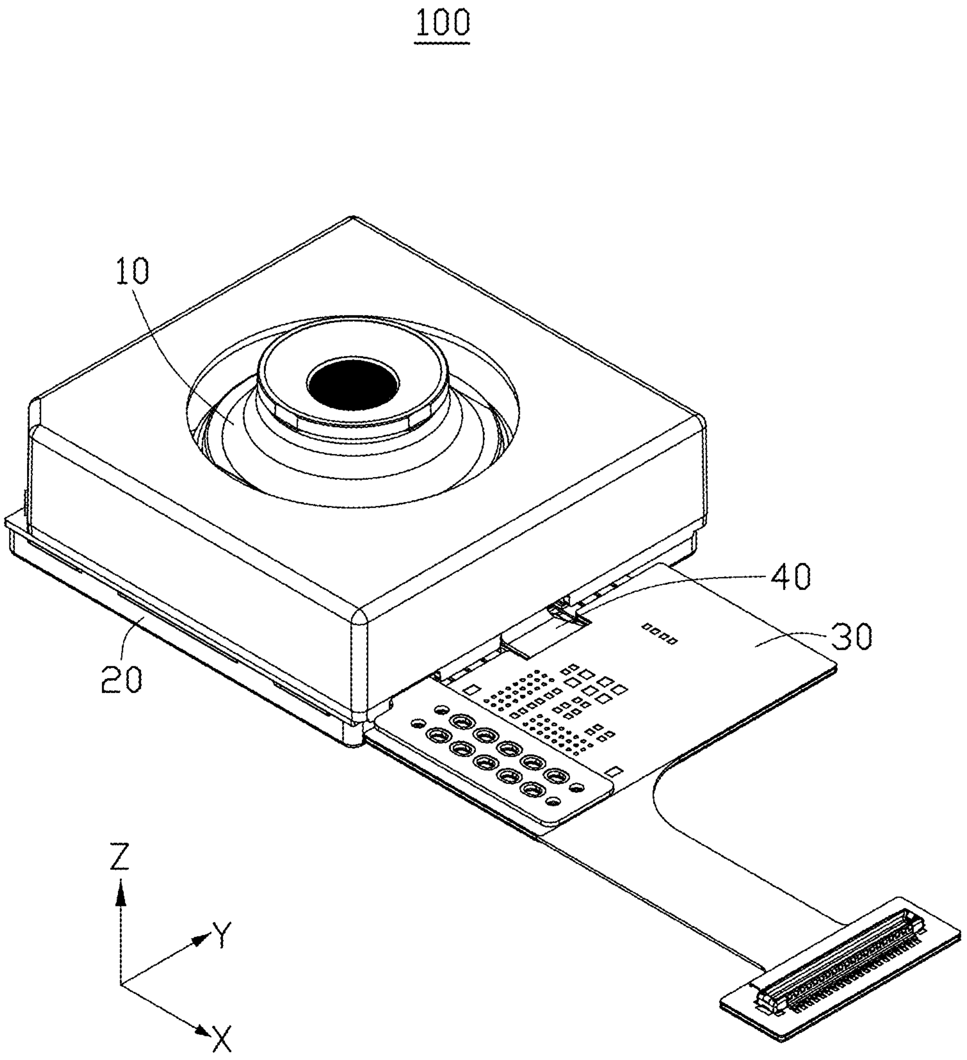
FIG. 1 is a diagrammatic view of a lens module according to an embodiment of the present application.

It will be appreciated that for simplicity and clarity of illustration, where appropriate, reference numerals have been repeated among the different FIGS. to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Figure 2:
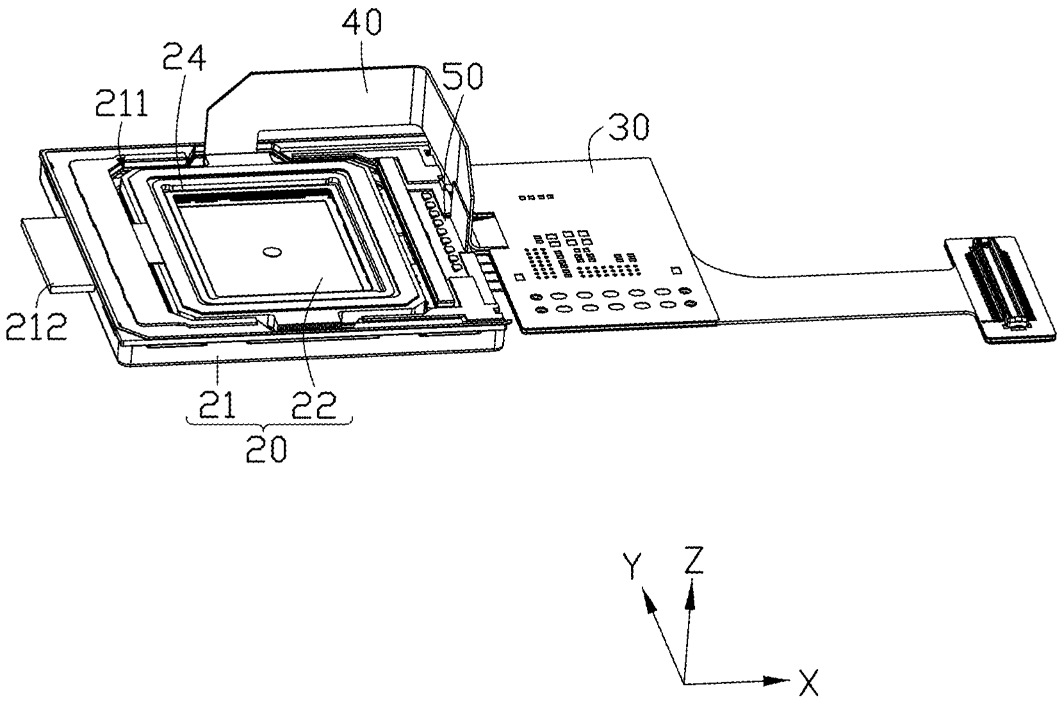
FIG. 2 is a diagrammatic view of a sensing assembly, a first circuit board, and a second circuit board of the lens module shown in FIG. 1.

Referring to FIGS. 1 and 2, a lens module 100 provided according to an embodiment of the present application. The lens module 100 includes a lens assembly 10, a sensing assembly 20, a first circuit board 30, and a second circuit board 40. The sensing assembly 20 includes a supporting member 21 and a sensor 22. The lens assembly 10 and the second 22 are disposed on one side of the supporting member 21 a first direction Z, and the sensor 22 faces the lens assembly 10 along the first direction Z. In some embodiments, the supporting member 21 may be provided with a receiving cavity 211, and the sensor 22 may be disposed in the receiving cavity 211.

Figure 3:
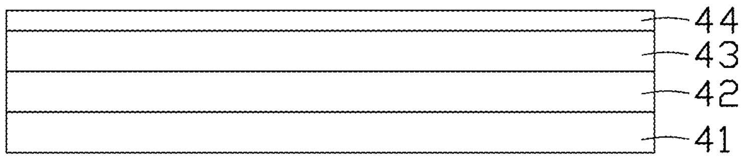
FIG. 3 is a cross-sectional view of the second circuit board of the lens module shown in FIG. 2.

Referring to FIGS. 2 and 3, the first circuit board 30 is disposed adjacent to the supporting member 21 along the second direction X. The first direction Z intersects with the second direction X. The second circuit board 40 is bent, one end of the second circuit board 40 is connect to the sensor 22, and another end of the second circuit board 40 is connect to the first circuit board 30. The second circuit board 40 includes a first structural layer 41, a second structural layer 42, a third structural layer 43, and a fourth structural layer 44, which are sequentially stacked. The first structural layer 41 is configured to transmit power signals, the third structural layer 43 is configured to transmit high-speed signals, and the second structural layer 42 and the fourth structural layer 44 are configured to connect to ground.

In the lens module 100 described above, the sensor 22 is connected to the first circuit board 30 and the second circuit board 40. The second circuit board 40 is bent, and two ends of the second circuit board 40 are connect to the sensor 22 and the first circuit board 30, respectively, thereby reducing an overall size of the lens module 100 and lowering the manufacturing cost of the lens module 100.

Referring again to FIGS. 1 and 2, in some embodiments, the sensing assembly 20 further includes a driving component 23 connected to the supporting member 21. The driving component 212 is used to drive the supporting member 21 and the sensor 22 thereon to move relative to the lens assembly 10. Thus, the anti-shake function of the lens module 100 is achieved.

Referring to FIG. 2, in some embodiments, the sensing assembly 20 further includes a connecting member 24 disposed between the sensor 22 and a cavity wall of the receiving cavity 211. The connecting member 24 is used to connect the sensor 22 and the supporting member 21, which improves the connection stability between the sensor 22 and the supporting member 21. In this embodiment, the connecting member 24 may be, but is not limited to, an adhesive layer.

In this embodiment, the supporting member 21 is made of steel, and the sensor 22 is disposed in the receiving cavity 211 of the supporting member 21, thereby improving the heat dissipation capability of the sensor 22.

Figure 4:
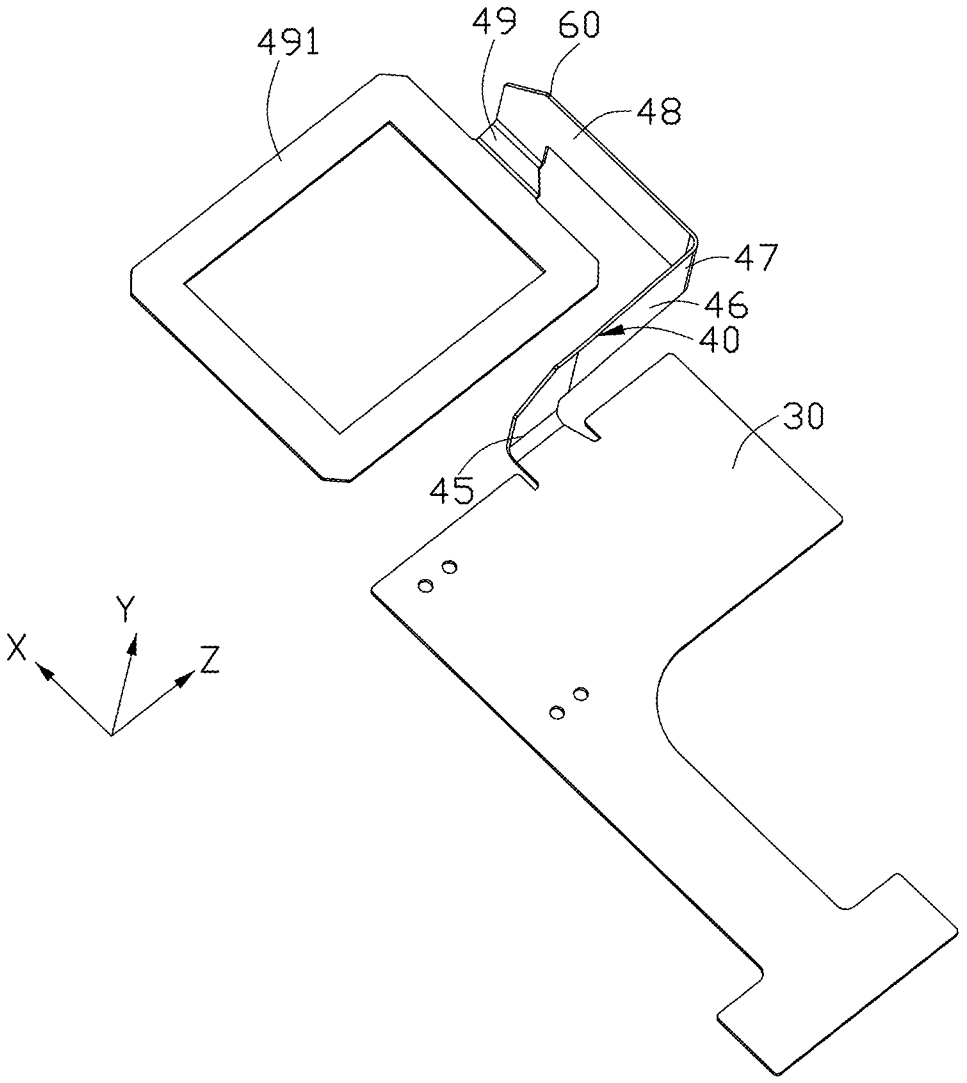
FIG. 4 is a diagrammatic view showing the second circuit board shown in FIG. 2.

Referring to FIGS. 2 and 4, in some embodiments, the second circuit board 40 includes a first bent portion 45, a first main portion 46, a second bent portion 47, a second main portion 48, and a third bent portion 49. The first bent portion 45 is connected to the first circuit board 30. One end of the first main portion 46 is connected to one end of the first bent portion 45 that is away from the first circuit board 30, and the other end of the first main portion 46 extends in a third direction Y to connect to the second bent portion 47. An end of the second bent portion 47 away from the first main portion 46 is connected to the second main portion 48. An end of the second main portion 48 away from the second bent portion 47 extends in the second direction X to connect to the third bent portion 49. An end of the third bent portion 49 away from the second main portion 48 extends into the receiving cavity 211 and is connected to the sensor 22. In some embodiment, the first direction Z, the second direction X, and the third direction Y are perpendicular to each other. With above arrangement, the first bent portion 45 connects the first main portion 46 and the first circuit board 30, and the second bent portion 47 connects the second main portion 48 and the sensor 22, thereby realizing an electrical connection between the sensor 22 and the first circuit board 30 through the second circuit board 40 with fewer bent portions, thereby reducing the manufacturing difficulty of the second circuit board 40.

Referring to FIGS. 2 and 4, in some embodiments, the second circuit board 40 further includes a ring portion 491, which is connected to an end of the third bent portion 49 away from the second main portion 48. The sensor 22 is disposed within the ring portion 491. The ring portion 491 improves the stability of the electrical connection between the second circuit board 40 and the sensor 22.

Referring to FIGS. 2 and 4, in some embodiments, each of the first main portion 46 and the second main portion 48 is provided with a reinforcing layer 60 to improve the structural strength of the first main portion 46 and the second main portion 48.

Referring again to FIGS. 2 and 4, in some embodiments, the first bent portion 45, the first main portion 46, the second bent portion 47, the second main portion 48, and the third bent portion 49 are integrally formed, which improves the structural strength of the second circuit board 40.

Referring to FIGS. 1, 2, and 4, in some embodiments, the lens module 100 further includes a stopper 50. The stopper 50 is connected to the side of the supporting member 21 near the first circuit board 30. The stopper 50 is used to support a sidewall of the first main portion 46 facing the supporting member 21. The stopper 50 is adjacent to a connection position between the first bent portion 45 and the first main portion 46, thereby reducing the risk of fracture at the connection position between the first bent portion 45 and the first main portion 46.

Figure 5:
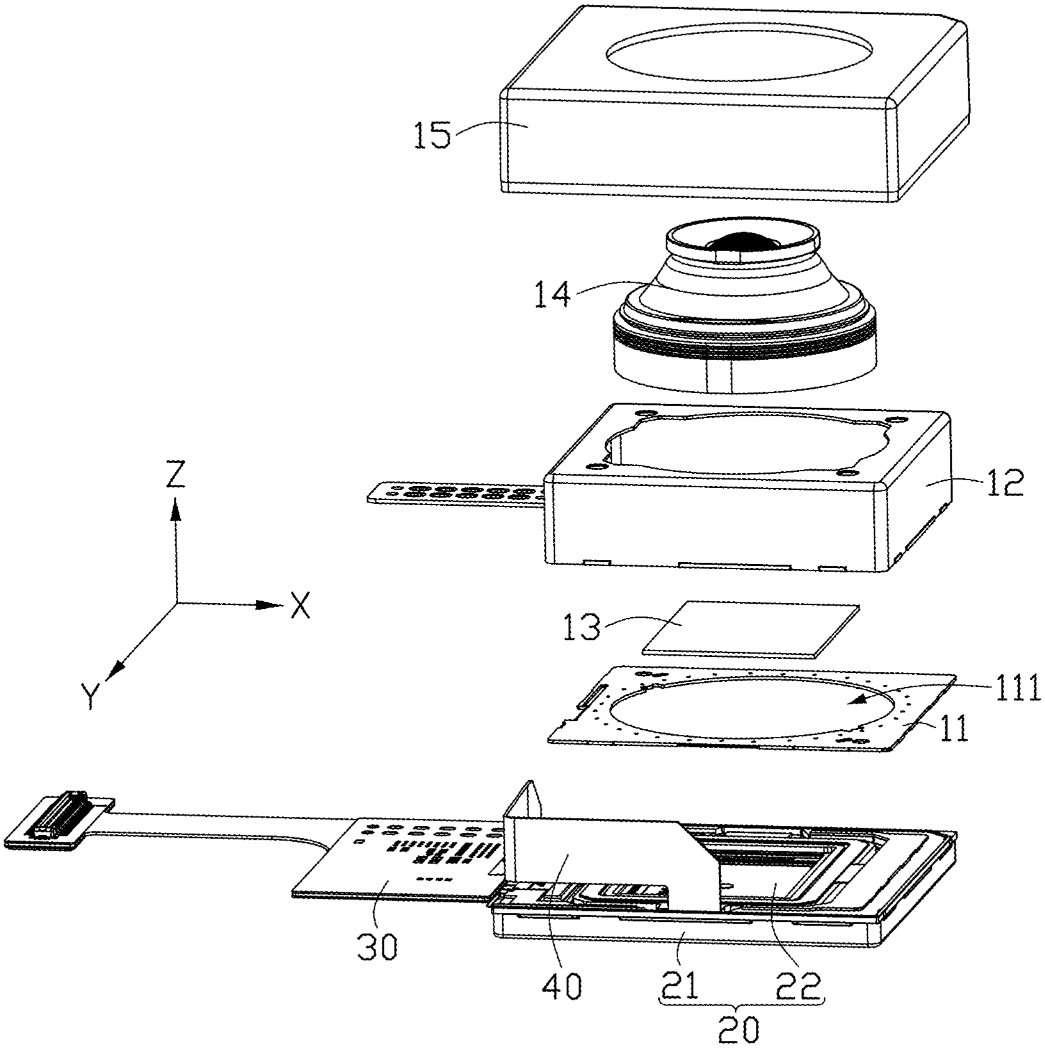
FIG. 5 is an exploded view of the lens assembly shown in FIG. 1.

Referring to FIGS. 1, 2, and 5, in some embodiments, the lens assembly 10 includes a bracket 11, a lens holder 12, a filter 13, and a lens 14. The bracket 11 is disposed within the receiving cavity 211. The bracket 11 is located on one side of the sensor 22 opposite to the supporting member 21 in the first direction Z. The bracket 11 defines a through hole 111. The through hole 111 faces the lens 14 and the sensor 22, which allows incoming light from the lens 14 to transmit to the sensor 22, thus, the sensor 22 convers the signal of the incoming light into electrical signals to generate images. The filter 13 is disposed within the through hole 111. The lens holder 12 is disposed on one side of the bracket 11 opposite the sensor 22, and the lens 14 is housed in the lens holder 12.

In some embodiments, the lens assembly 10 further includes a voice coil motor (not shown), which is connected between the lens 14 and the filter 13. The voice coil motor is used to achieve an automatic focusing function of the lens 14.

Referring again to FIGS. 1, 2, and 5, in some embodiments, the lens assembly 10 further includes a shielding housing 15. The shielding housing 15 is sleeved on the outer side of the lens holder 12. The lens 14 is exposed from the shielding housing 15. The first main portion 46, the second bent portion 47, and the second main portion 48 are disposed between the lens holder 12 and the shielding housing 15. With above arrangement, the shielding housing 15 reduces the interference from external environment that may affect the lens 14 and the filter 13 within the lens holder 12.

Figure 6:
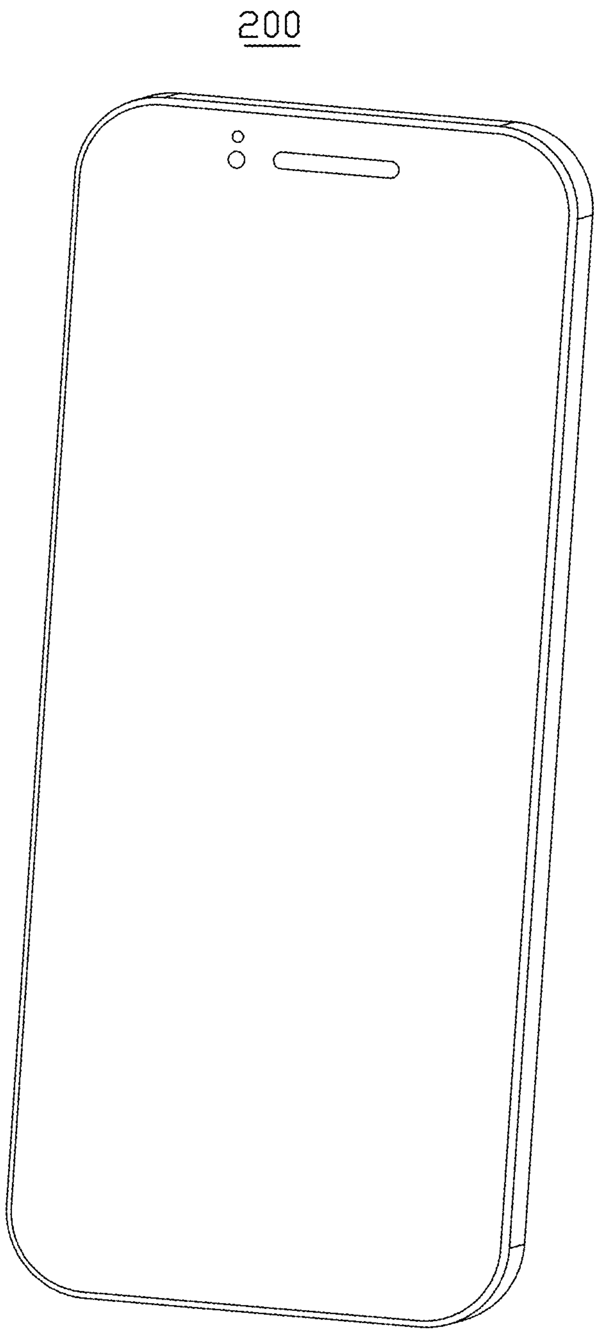
FIG. 6 is a diagrammatic view of an electronic device according to an embodiment of the present application.

Referring to FIGS. 1 and 6, the present application also provides an electronic device 200, which includes the lens module 100 described in any of the embodiments mentioned above. In some embodiments, the electronic device of the present application may include, but is not limited to, a mobile phone, a wearable device, a vehicle, a camera, or a surveillance device.

The embodiments shown and described above are only examples. Many details are often found in the art such as the other features of the lens module 100. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A lens module comprising:

a lens assembly;

a sensing assembly;

a first circuit board, and a second circuit board;

wherein the sensing assembly comprises a supporting member and a sensor, the lens assembly and the sensor are disposed on one surface of the supporting member in a first direction, the sensor is disposed between the supporting member and the lens assembly and faces the lens assembly along the first direction; the first circuit board is disposed adjacent to the supporting member in a second direction, the first direction intersects with the second direction; one portion of the second circuit board is bent to connect to the sensor and another portion of the second circuit board is bent to connect to the first circuit board; the second circuit board comprises a first structural layer, a second structural layer, a third structural layer, and a fourth structural layer sequentially stacked, wherein the first structural layer is configured to transmit power signals, the third structural layer is configured to transmit high-speed signals, and the second structural layer and the fourth structural layer are configured to connect to ground.

2. The lens module of claim 1, wherein the second circuit board further comprises a first bent portion, a first main portion, a second bent portion, a second main portion, and a third bent portion, the first bent portion is connected to the first circuit board, one end of the first main portion away from the first circuit board is connected to an end of the first bent portion, another end of the first main portion extends in a third direction to connect to the second bent portion, one end of the second bent portion away from the first main portion is connected to the second main portion, one end of the second main portion away from the second bent portion extends in the second direction to connect to the third bent portion, and each two of the first direction, the second direction, and the third direction are perpendicular to each other.

3. The lens module of claim 2, wherein the supporting member defines a receiving cavity, and an end of the third bent portion away from the second main portion extends into the receiving cavity and is connected to the sensor.

4. The lens module of claim 2, wherein each of the first main portion and the second main portion comprises a reinforcing layer.

5. The lens module of claim 2, wherein the first bent portion, the first main portion, the second bent portion, the second main portion, and the third bent portion are integrally formed.

6. The lens module of claim 2, further comprising a stopper, wherein the stopper is connected to one side of the supporting member near the first circuit board, the stopper is configured to support a sidewall of the first main portion facing the supporting member.

7. The lens module of claim 3, wherein the lens assembly comprises a bracket, a lens holder, a filter, and a lens, the bracket is disposed in the receiving cavity and located on one side of the sensor opposite to the supporting member in the first direction, the bracket defines a through hole facing the sensor, the filter is disposed in the through hole, the lens holder is disposed on one side of the bracket opposite to the sensor, and the lens is received in the lens holder.

8. The lens module of claim 7, wherein the lens assembly further comprises a shielding housing, the shielding housing is sleeved on the lens holder, the lens is exposed from the shielding housing, and each of the first main portion, the second bent portion, and the second main portion is disposed between the lens holder and the shielding housing.

9. The lens module of claim 2, wherein the sensing assembly further comprises a connecting member, the connecting member is disposed between the sensor and a cavity wall of the receiving cavity, and is configured to connect the sensor to the supporting member.

10. The lens module of claim 1, wherein the sensing assembly further comprises a driving component, the driving component is connected to the supporting member and configured to drive the supporting member and the sensor to move relative to the lens assembly.

11. An electronic device comprising a lens module comprising:

a lens assembly;

a sensing assembly comprising a supporting member and a sensor;

a first circuit board, and a second circuit board, wherein the supporting member is disposed on one side of the lens assembly in a first direction, the sensor is disposed between the supporting member and the lens assembly, the sensor is arranged opposite to the lens assembly along the first direction; the first circuit board is disposed adjacent to the supporting member in a second direction, the first direction intersects the second direction; one portion of the second circuit board is bent to connect to the sensor and another portion of the second circuit board is bent to connect to the first circuit board; the second circuit board comprises a first structural layer, a second structural layer, a third structural layer, and a fourth structural layer sequentially stacked, wherein the first structural layer is configured to transmit power signals, the third structural layer is configured to transmit high-speed signals, and the second structural layer and the fourth structural layer are configured to connect to ground signals.

12. The electronic device of claim 11, wherein the second circuit board further comprises a first bent portion, a first main portion, a second bent portion, a second main portion, and a third bent portion, the first bent portion is connected to the first circuit board, one end of the first main portion, away from the first circuit board, is connected to the end of the first bent portion, another end of the first main portion extends in a third direction to connect to the second bent portion, one end of the second bent portion, away from the first main portion, is connected to the second main portion, one end of the second main portion, away from the second bent portion, extends in the second direction to connect to the third bent portion, the first direction, the second direction, and the third direction are mutually perpendicular.

13. The electronic device of claim 12, wherein the supporting member is provided with a receiving cavity, and the end of the third bent portion, away from the second main portion, extends into the receiving cavity and is connected to the sensor.

14. The electronic device of claim 12, wherein a reinforcing layer is disposed within both the first main portion and the second main portion.

15. The electronic device of claim 12, wherein the first bent portion, the first main portion, the second bent portion, the second main portion, and the third bent portion are integrally formed.

16. The electronic device of claim 12, wherein the lens module further comprises a stopper, the stopper is connected to one side of the supporting member near the first circuit board to reduce the risk of breakage at the connection point between the first bent portion and the first main portion.

17. The electronic device of claim 12, wherein the lens assembly comprises a bracket, a lens holder, a filter, and a lens, the bracket is disposed within the receiving cavity and is located on one side of the sensor opposite to the supporting member in the first direction, the bracket defines a through hole for the lens to transmit signals to the sensor, the filter is disposed within the through hole, the lens holder is disposed on one side of the bracket opposite the sensor, the lens is housed in the lens holder.

18. The electronic device of claim 17, wherein the lens assembly further comprises a shielding housing, the shielding housing is sleeved on an outer side of the lens holder, the lens exposed outside the shielding housing, the first main portion, the second bent portion, and the second main portion are disposed between the lens holder and the shielding housing.

* * * * *